US009484604B2

United States Patent
Schaffner et al.

(10) Patent No.: US 9,484,604 B2
(45) Date of Patent: Nov. 1, 2016

(54) BATTERY MODULE SYSTEM (71) Applicant: The Boeing Company, Chicago, IL (US)

(72) Inventors: Lowell W. Schaffner, Seattle, WA (US); Mehdy Barekatein, Kirkland, WA (US); Sheverria Antony Aikens, Mill Creek, WA (US); Frederic Lacaux, Woodinville, WA (US)

(73) Assignee: The Boeing Company, Chicago, IL (US)

(*) Notice: Subject to any disclaimer, the term of this patent is extended or adjusted under 35 U.S.C. 154(b) by 255 days.

(21) Appl. No.: 14/018,047

(22) Filed: Sep. 4, 2013

(65) Prior Publication Data

US 2014/0242420 A1    Aug. 28, 2014

Related U.S. Application Data (60) Provisional application No. 61/769,173, filed on Feb. 25, 2013.

(51) Int. Cl.
| | | |
|---|---|---|
| *H01M 12/00* | (2006.01) | |
| *H01M 10/48* | (2006.01) | |
| *H01M 10/42* | (2006.01) | |
| *G01R 31/36* | (2006.01) | |
| *H02J 7/00* | (2006.01) | |

(52) U.S. Cl.
CPC ............ *H01M 10/48* (2013.01); *H01M 10/486* (2013.01); *G01R 31/3606* (2013.01); *H01M 2010/4271* (2013.01); *H01M 2010/4278* (2013.01); *H01M 2220/20* (2013.01); *H02J 2007/0001* (2013.01)

(58) Field of Classification Search
CPC ............. H01M 10/48; H01M 10/486; H01M 2010/4271; H01M 2010/4278; H01M 2220/20
See application file for complete search history.

(56) References Cited

U.S. PATENT DOCUMENTS

| | | | |
|---|---|---|---|
| 2005/0162129 A1 | 7/2005 | Mutabdzija et al. | |
| 2007/0046261 A1 | 3/2007 | Porebski | |
| 2007/0108946 A1* | 5/2007 | Yamauchi | H01M 10/42 320/132 |
| 2012/0295139 A1 | 11/2012 | Jeong et al. | |

FOREIGN PATENT DOCUMENTS

| | | |
|---|---|---|
| CN | 202749476 U | 2/2013 |
| GB | 2449966 | 12/2008 |
| WO | 2012165771 | 12/2012 |

OTHER PUBLICATIONS

Office Action for Canadian Application No. 2,837,941 dated Jun. 3, 2015.
Translation of Office Action and Search Report for Chinese Patent Application No. 201410065006.7 dated Aug. 21, 2015.
Office Action for Chinese Application No. 201410065006.7 dated Feb. 6, 2016.
Extended European Search Report for European Application No. 14151864.7 dated Aug. 4, 2014.
Translation of Notification of the Decision of Rejection for Chinese Patent Application No. 201410065006.7 dated Jul. 1, 2016.

\* cited by examiner

*Primary Examiner* — Jane Rhee
(74) *Attorney, Agent, or Firm* — Kunzler Law Group, PC (57) ABSTRACT

A battery module system includes at least one cell and a battery module processor. The battery module processor may be configured to receive at least one cell signal associated with the at least one cell, wherein the at least one cell signal includes at least one of a temperature signal, a voltage signal, or a current signal. The battery module processor may be also configured to determine a status of the at least one cell based on the at least one cell signal. The battery module system may be configured to removably connect to a master/module interface, and to deliver power from the at least one cell to the master/module interface. The battery module system may be also configured to communicate, from the battery module processor, the status of the at least one cell to the master/module interface.

14 Claims, 7 Drawing Sheets

BATTERY MODULE SYSTEM

CROSS REFERENCE TO RELATED APPLICATIONS

This application claims the benefit of U.S. Provisional Patent Application No. 61/769,173, filed on Feb. 25, 2013, the entirety of which is herein incorporated by reference.

FEDERALLY SPONSORED RESEARCH OR DEVELOPMENT

[Not Applicable]

JOINT RESEARCH AGREEMENT

[Not Applicable]

SEQUENCE LISTING

[Not Applicable]

BACKGROUND

Generally, this application relates to providing power with a battery module system, for example, in a vehicle such as an aircraft.

BRIEF SUMMARY

According to an embodiment, a battery module system may include at least one cell and a battery module processor. The battery module processor may be configured to receive at least one cell signal associated with the at least one cell, wherein the at least one cell signal includes at least one of a temperature signal, a voltage signal, or a current signal. The battery module processor may be also configured to determine a status (for example, state of charge, state of capacity, or health) of the at least one cell based on the at least one cell signal. The battery module system may be configured to removably connect to a master/module interface, and to deliver power from the at least one cell to the master/module interface. The battery module system may be also configured to communicate, from the battery module processor, the status of the at least one cell to the master/module interface.

According to an embodiment, a system for providing power includes a master/module interface and a battery master system. The master/module interface may be configured to removably connect to a first battery module system and receive power from at least one cell in the first battery module system. The master/module interface may also be configured to receive, from a battery module processor in the first battery module system, a status of the at least one cell in the first battery module system. The battery master system may be connected to the master/module interface and may include a battery master processor. The battery master system may be configured to receive, from the master/module interface, the power from the at least one cell in the first battery module system, and deliver, from the master/module interface, the status of the at least one cell in the first battery module system to the battery master processor.

According to another embodiment, the master/module interface may also be configured to removably connect to a second battery module system and receive power from at least one cell in the second battery module system. The master/module interface may also be configured to receive, from a battery module processor in the second battery module system, a status of the at least one cell in the second battery module system. The battery master system may be configured to receive, from the master/module interface, the power from the at least one cell in the second battery module system, and deliver, from the master/module interface, the status of the at least one cell in the second battery module system to the battery master processor.

According to an embodiment, a method for providing power in an aircraft may include receiving, at a battery module processor in a battery module, at least one cell signal associated with at least one cell in the battery module. Such a cell signal may include a temperature signal, a voltage signal, or a current signal. The method may also include determining, by the battery module processor, a status (for example, state of charge, state of capacity, or health) of the at least one cell based on the at least one cell signal. The method may also include communicating, from the battery module processor, the status of the at least one cell to a removably connectable master/module interface. The method may also include delivering power from the at least one cell to the master/module interface.

According to an embodiment, a method for battery verification within a vehicle includes receiving status information from a first battery module, receiving status information from a second battery module, and verifying the status information of the first battery module and the status information of the second battery module to meet at least one of predefined mission requirements, or compatibility requirements of the vehicle. The battery modules may have different cell chemistries. If the vehicle is an aircraft, the battery modules may be verified to meet mission requirements, such as the type of flight, the duration of the flight, or equipment to be used during the flight.

According to an embodiment, a system includes at least one cell configured to supply power, and a battery module processor. The battery module processor is configured to: receive at least one cell signal associated with the at least one cell, wherein the at least one cell signal includes at least one of a temperature signal, a voltage signal, or a current signal, and determine a status (for example, a state of charge of the at least one cell, a state of capacity of the at least one cell, or a health of the at least one cell) of the at least one cell based on the at least one cell signal. The system may be configured to removably connect to a master/module interface, deliver the power from the at least one cell to the master/module interface, and communicate, from the battery module processor, the status of the at least one cell to the master/module interface. The battery module processor may also communicate at least one of security information or identification information to a master/module interface. The system may also perform a test of the system, and communicate a result of the test to a master/module interface According to an embodiment, a system for providing power includes a master/module interface that removably connects to a first battery module system, receives power from at least one cell in the first battery module system, and receives, from a battery module processor in the first battery module system, a status of the at least one cell in the first battery module system (for example, at least one of a state of charge of the at least one cell of the first battery, a state of capacity of the at least one cell of the first battery, or a health of the at least one cell of the first battery). The system also includes a battery master system connected to the master/module interface and including a battery master processor. The battery master system is configured to receive, from the master/module interface, the power from the at least one cell in the first battery module system, and deliver, from the master/module interface, the status of the at least one cell in the first battery module system to the battery master processor.

The master/module interface may removably connect to a second battery module system, receive power from at least one cell in the second battery module system, and receive, from a battery module processor in the second battery module system, a status of the at least one cell in the second battery module system. The battery master system may receive, from the master/module interface, the power from the at least one cell in the second battery module system, and deliver, from the master/module interface, the status of the at least one cell in the second battery module system to the battery master processor.

A chemistry of the at least one cell in the first battery module system may be different from a chemistry of the at least one cell in the second battery module system. The battery master system may determine whether the first battery module system is compatible with the second battery module system. The battery master system may cause the power from the at least one cell in the first battery module system to be disconnected from the master/module interface, and cause the power from the at least one cell in the second battery module system to be disconnected from the master/module interface. The battery master system is may cause the power from the at least one cell in the first battery module system to be disconnected from the master/module interface through a disconnect in the first battery module system, and cause the power from the at least one cell in the second battery module system to be disconnected from the master/module interface through a disconnect in the second battery module system. The battery master system may provide recharging power to the master/module interface for the at least one cell of the first battery module and the at least one cell of the second battery module.

According to an embodiment, a method for providing power in an aircraft includes receiving, at a battery module processor in a battery module, at least one cell signal associated with at least one cell in the battery module, wherein the at least one cell signal includes at least one of a temperature signal, a voltage signal, or a current signal. The method also includes determining, by the battery module processor, a status of the at least one cell based on the at least one cell signal. The method also includes communicating, from the battery module processor, the status of the at least one cell to a removably connectable master/module interface. The method also includes delivering power from the at least one cell to the master/module interface. The power may be delivered when predefined mission requirements, regulatory requirements, and compatibility requirements of the aircraft are met.

According to an embodiment, a method includes receiving status information from at least one module wherein the at least one module is configured to provide power in a vehicle, and verifying the status information of the at least one module meets at least one of predefined mission requirements, regulatory requirements, or compatibility requirements of the vehicle. The at least one module may include a plurality of cells and the compatibility requirements may include a verification that the plurality of cells are compatible with one another. The mission requirements may include a listing of equipment which require power during a defined mission and an expected duration of use. The method may include delivering power from the at least one module to an airplane host system in the vehicle when the predefined mission requirements, regulatory requirements, and compatibility requirements are met.

According to an embodiment, a battery module system may include at least one cell and a battery module processor. The battery module processor may be configured to receive at least one cell signal associated with the at least one cell, wherein the at least one cell signal includes at least one of a temperature signal, a voltage signal, or a current signal. The battery module processor may be also configured to determine a status (for example, state of charge, state of capacity, or health) of the at least one cell based on the at least one cell signal. The battery module system may be configured to removably connect to a master/module interface, and to deliver power from the at least one cell to the master/module interface. The battery module system may be also configured to communicate, from the battery module processor, the status of the at least one cell to the master/module interface.

According to an embodiment, a system for providing power includes a master/module interface and a battery master system. The master/module interface may be configured to removably connect to a first battery module system and receive power from at least one cell in the first battery module system. The master/module interface may also be configured to receive, from a battery module processor in the first battery module system, a status of the at least one cell in the first battery module system. The battery master system may be connected to the master/module interface and may include a battery master processor. The battery master system may be configured to receive, from the master/module interface, the power from the at least one cell in the first battery module system, and deliver, from the master/module interface, the status of the at least one cell in the first battery module system to the battery master processor.

According to another embodiment, the master/module interface may also be configured to removably connect to a second battery module system and receive power from at least one cell in the second battery module system. The master/module interface may also be configured to receive, from a battery module processor in the second battery module system, a status of the at least one cell in the second battery module system. The battery master system may be configured to receive, from the master/module interface, the power from the at least one cell in the second battery module system, and deliver, from the master/module interface, the status of the at least one cell in the second battery module system to the battery master processor.

According to an embodiment, a method for providing power in an airplane may include receiving, at a battery module processor in a battery module, at least one cell signal associated with at least one cell in the battery module. Such a cell signal may include a temperature signal, a voltage signal, or a current signal. The method may also include determining, by the battery module processor, a status (for example, state of charge, state of capacity, or health) of the at least one cell based on the at least one cell signal. The method may also include communicating, from the battery module processor, the status of the at least one cell to a removably connectable master/module interface. The method may also include delivering power from the at least one cell to the master/module interface.

The foregoing summary, as well as the following detailed description of certain techniques of the present application, will be better understood when read in conjunction with the appended drawings. For the purposes of illustration, certain techniques are shown in the drawings. It should be understood, however, that the claims are not limited to the arrangements and instrumentality shown in the attached drawings. Furthermore, the appearance shown in the drawings is one of many ornamental appearances that can be employed to achieve the stated functions of the system.

DESCRIPTION

Figure 1:
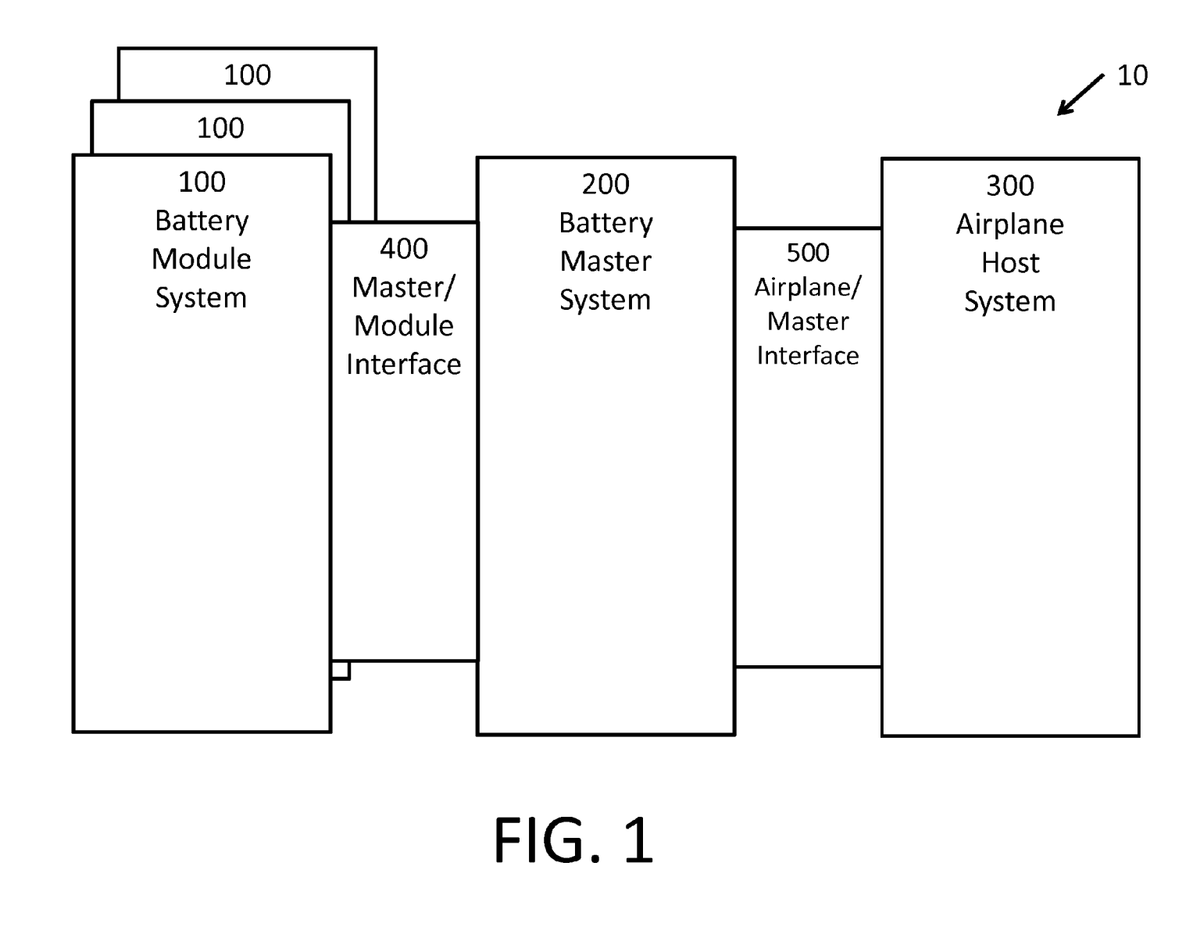
FIG. 1 illustrates a system for providing battery power, according to techniques of the present application.

FIG. 1 illustrates a system 10 for providing battery power, according to techniques of the present application. The system 10 may include one or more battery module systems 100, a battery master system 200, and an aircraft host system 300. Each of the battery module systems 100 (for simplicity, a "battery module system" may be referred to as a "module" or "module system") may be removably connectable to a master/module interface 400. To simplify the description herein, a description of one module 100 may apply to additional modules 100. One or more modules 100 may be combined in series or parallel (or some combination thereof) to form a battery. The number and configuration of modules 100 may be determined according to desired voltage and battery capacity.

The battery master system 200 (for simplicity, a "battery master system" may be referred to as a "master" or "master system") may be connected to the master/module interface 400. The master system 200 may interface with the aircraft host system 300 through an aircraft/master interface 500.

Figure 2:
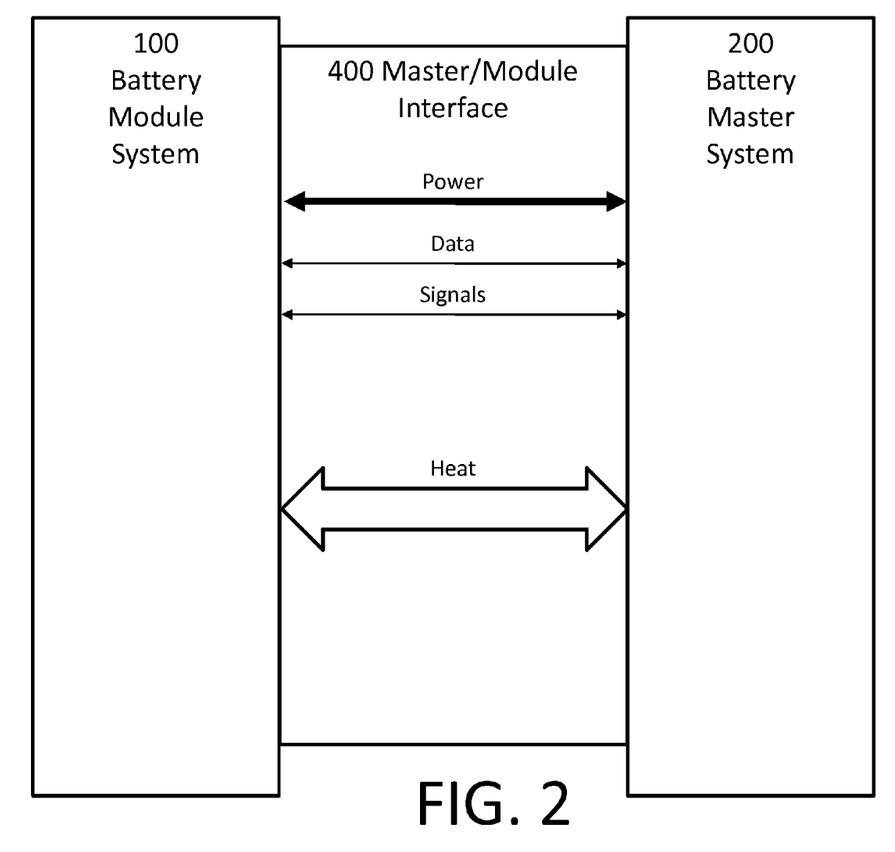
FIG. 2 illustrates a system for providing battery power, according to techniques of the present application.

As illustrated in FIG. 2, power, data, information, or signals may be communicated, delivered, or transferred between (for example, to and from) the module 100 and the master 200 via the master/module interface 400. The data lines may be isolated from the power or signal lines. This may be useful, for example, when there are multiple modules 100 or for regulatory requirements purposes. Data may be transmitted by optical, digital electronic lines, data bus, analog electronic lines, wirelessly, or the like.

Heat may also be transferred into (or via) the master/module interface 400. For example, heat may be transferred from the module 100 into the master/module interface 400 where the heat may be dissipated, for example, with water, convective air, conduction, or heat piping.

Figure 3:
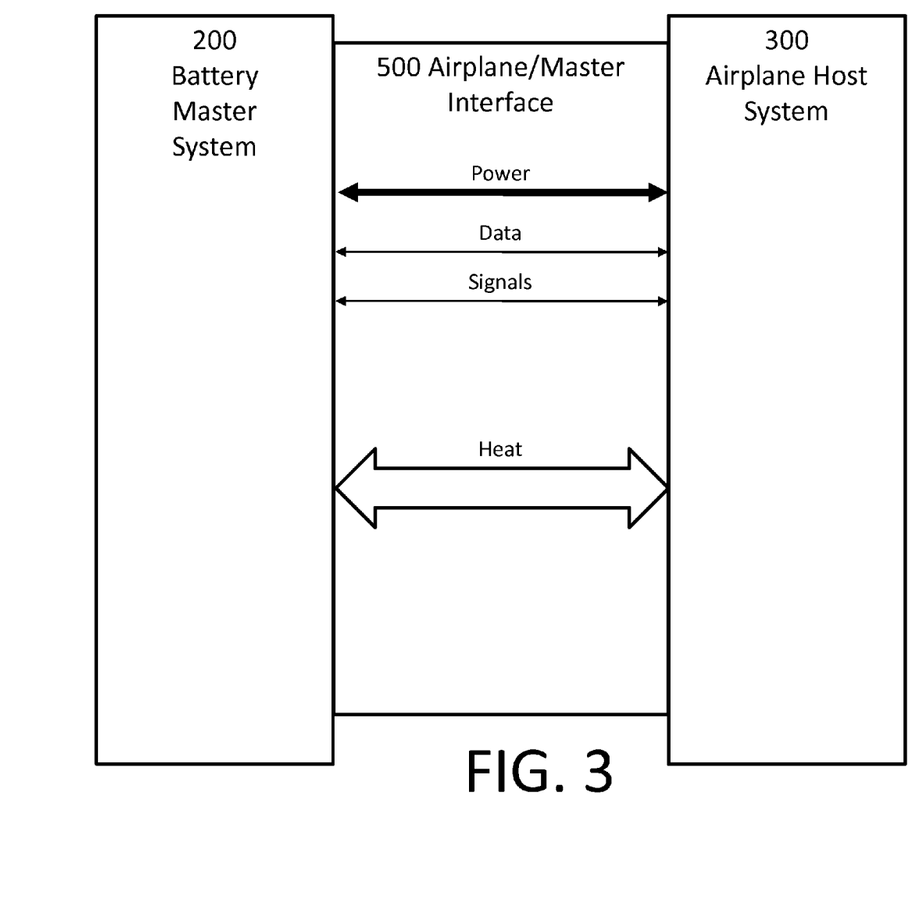
FIG. 3 illustrates a system for providing battery power, according to techniques of the present application.

As illustrated in FIG. 3, power, data, and signals may be communicated, delivered, or transferred between the master 200 and the aircraft host system 300 via the aircraft/master interface 500. Data may be transmitted by optical, digital electronic lines, data bus, analog electronic lines, wirelessly, or the like. Heat may also be transferred into (or via) the aircraft/master interface 500. For example, heat may be transferred from the master 200 into the aircraft/master interface 500 where the heat may be dissipated, for example, with water, convective air, conduction, or heat piping.

Figure 4A:
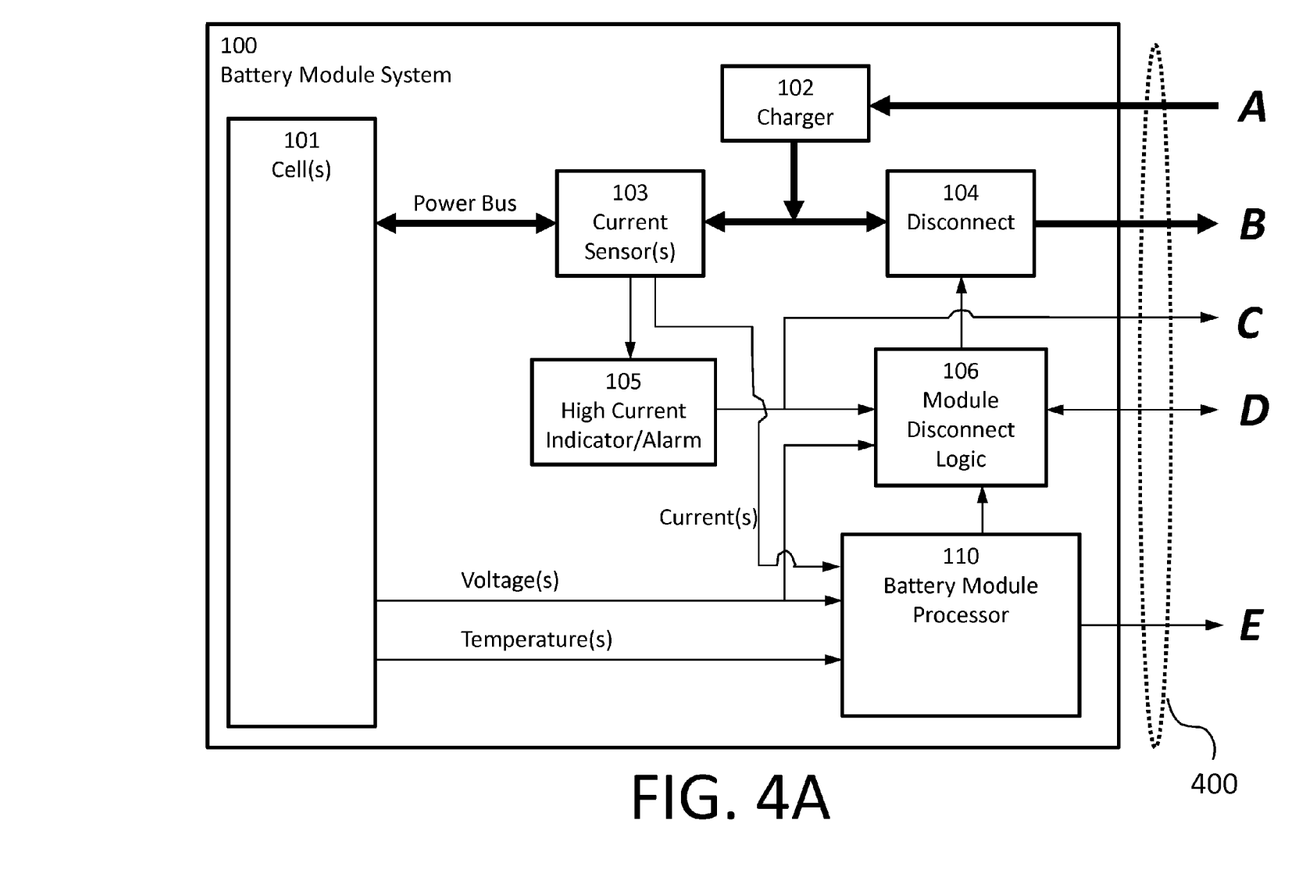
FIG. 4A illustrates a battery module system, according to techniques of the present application.
Figure 4B:
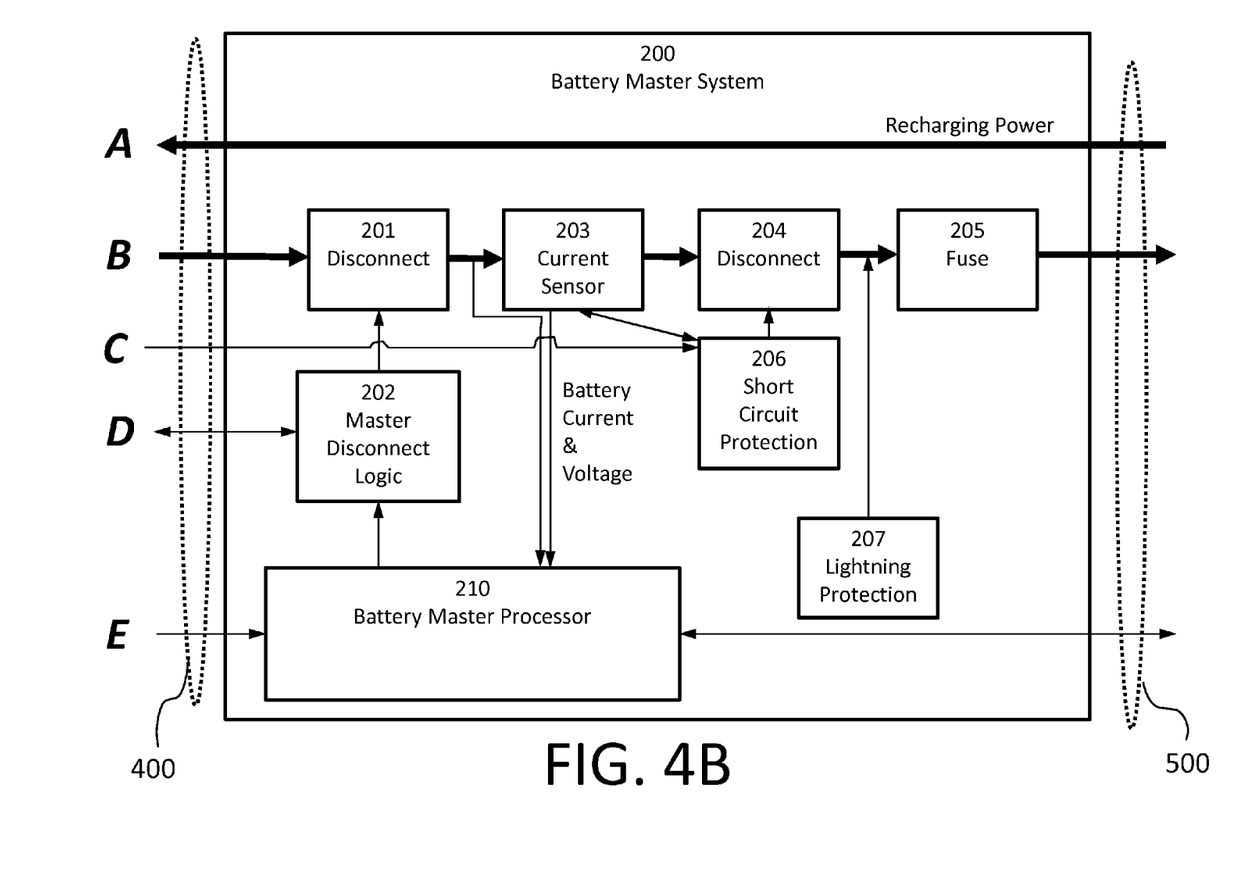
FIG. 4B illustrates a battery master system, according to techniques of the present application.

FIGS. 4A and 4B illustrate a battery module system 100 and a battery master system 200, according to techniques of the present application. The module 100 may include one or more cells 101. The cells 101 (referred to as plural for the sake of clarity but can also refer to only one cell) may include one or more energy storage units connected in series or parallel to form an energy storage unit of sufficient energy and power to perform the intended function of the module 100. Energy storage units may be, for example, electrochemical batteries, capacitors, ultra/super-capacitors, Li-ion capacitors or other energy storage devices. Electrochemical batteries may be, for example, Lithium-ion, nickel-cadmium, lead-acid, or other viable chemistries.

The cells 101 may also be considered to include associated circuitry, such as thermal sensors, electrical interfaces, voltage sensors, balancing taps, or resistors. The cells 101 may include a cooling/heating thermal interface. Electrical power may flow to and from the cells 101 via a power bus. The cells 101 may deliver power to and through the master/module interface 400 and to the battery master system 200.

The module 100 may also include a charger 102 that performs recharging functions on the cells 101. The charger 102 may receive power (for example, unregulated power) delivered from the aircraft host system 500. The charger 102 may receive recharging power from the master/module interface 400 and may deliver the recharging power to the cells 101. The charger 102 may convert the received recharging power into regulated, controlled power to safely or efficiently charge the cells 101 as determined by the device used.

The charger 102 may include or be controlled according to a charge algorithm. The charge algorithm may be implemented either as analog charger settings or by digital settings stored in a non-volatile memory device.

The module 100 may also include one or more current sensors 103. There may be one current sensor 103 for each cell 101, or there may be a current sensor 103 for all of the cells 101 or a portion of the cells 101. The current sensor 103 may generate a signal corresponding to a magnitude of current running through a power bus.

The module 100 may also include a disconnect 104. The disconnect 104 may be capable of interrupting the power delivered from the module 100 to the master/module interface 400 and to the master 200. The disconnect 104 may receive one or more signals from module disconnect logic 106 that will inform the disconnect 104 whether or not to interrupt the flow of power from the module 100. The disconnect 104 may include a relay (for example, a solid-state relay) or other switching-type device.

The module disconnect logic 106 may receive various signals as illustrated in FIGS. 4A and 4B. Based on the state of these signals, the module disconnect logic 106 may output a signal to the disconnect 104 to inform it to interrupt power from flowing from the module 100. The disconnect 104 may be normally electrically disconnected to allow the module 100 to be plugged into the master 200 (via the master/module interface 400). The disconnect 104 may be electrically connected with the permission or control by the master disconnect logic 106. The disconnect 104 may subsequently electrically disconnect the module 100 from the master/module interface 400 and master 200 in response to certain conditions. Such conditions may include a sensed overcurrent, cell(s) 101 or total module voltage being too high or low, cell(s) 101 or the total module being too hot or cold, or other failure conditions. Such conditions may be measured and/or determined, for example, by the current sensor 103, cell 101, battery module processor 110, high current indicator/alarm 105, and/or the module disconnect logic 106. As another option, the module disconnect logic 106 may receive signals or data from the master 200 (via the master/module interface 400) that there has been a short circuit event in the master or in the aircraft system 500. In such a case, the module disconnect logic 106 may cause the disconnect 104 to electrically disconnect the module 100 from the master 200 and master/module interface 400 to allow time for the master 200 to itself electrically disconnect from the module 100, aircraft system 500, or interfaces thereto.

The module 100 may also include a high current indicator or alarm 105 that receives a signal from the current sensor 103 and determines whether current is over a given threshold. The high current indicator or alarm 105 may communicate with the module disconnect logic 106 to provide information on whether power from the module 100 should be disconnected from flowing to the master 200.

Figure 5:
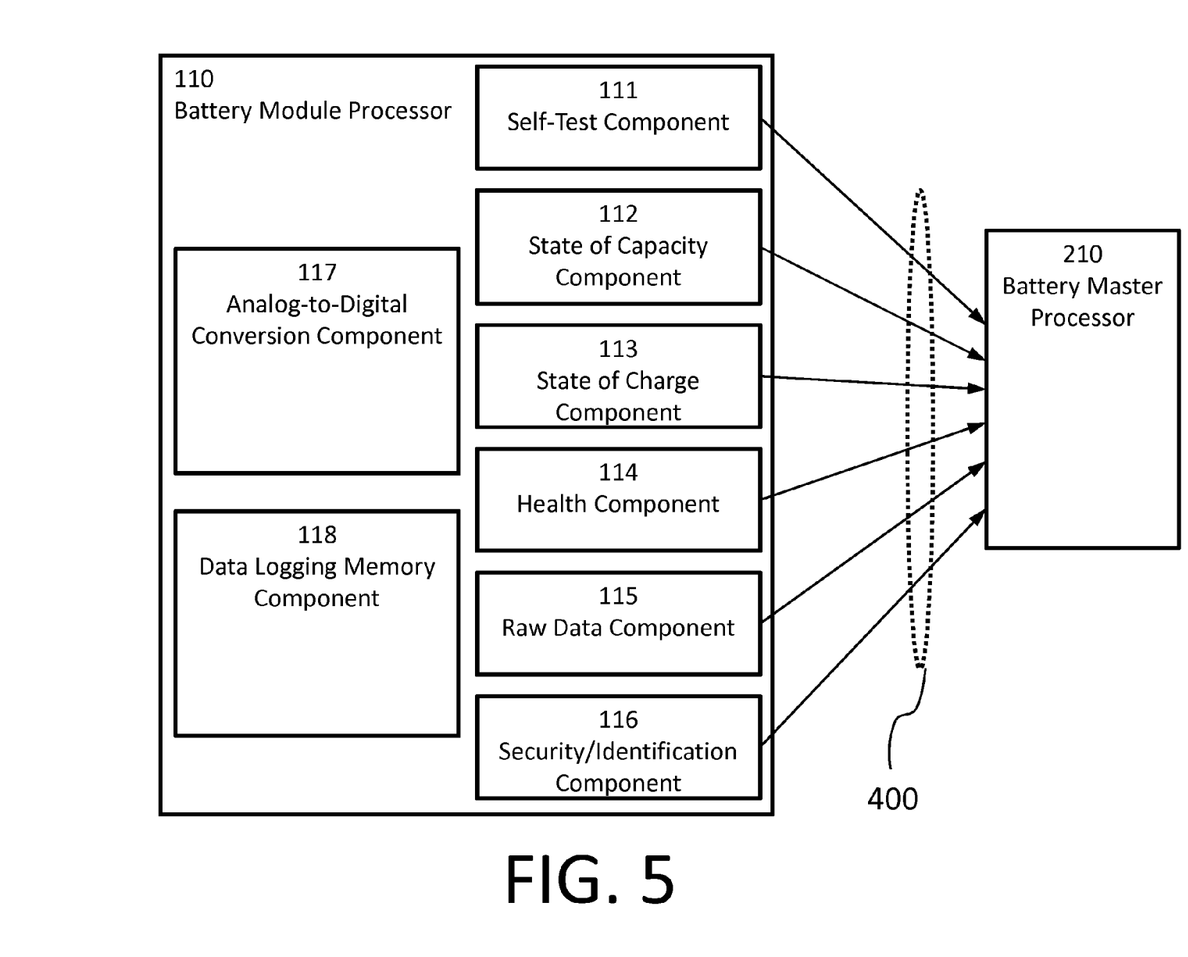
FIG. 5 illustrates a battery module processor and a battery master processor, according to techniques of the present application.

Referring also to FIG. 5, the battery module processor 110 may include one or more processors (for example, CPU, DSP, microcontroller, microprocessor, or the like) and associated memory (for example, flash memory, EEPROM, RAM, or the like). The battery module processor 110 may execute software instructions stored on one or more of the computer-readable mediums such as associated memory.

The battery module processor 110 may include an analog-to-digital conversion component 117 and a data logging memory component 118. The analog-to-digital conversion component 117 may receive analog signals generated or associated with the cells 101, such as temperature signals, voltage signals, or current signals. The analog-to-digital conversion component 117 may convert such signals to digital data which may be subject to further processing by the battery module processor 110.

The data logging memory component 118 may store data over time to provide data history that may be useful for further processing. At least some of the digital data generated by the analog-to-digital conversion component 117 may be stored in the data logging memory component 118.

The battery module processor 110 may also include a test component 111. This test component may exercise one or more components in the module 100, test internal power supply voltages, test health of the cell 101, and perform other functional checks on a startup, continuous, or on-demand basis. The results of such tests may be communicated to the master 200 (via the master/module interface 400) to determine overall health of the module 100 and to potentially flag the module 100 for repair/replacement as warranted. A fault code may be sent detailing certain specifics of one or more component failures. Results may also be used to inhibit function of the module 100.

The battery module processor 110 may also include a state of capacity component 112, a state of charge component 113, and a health component 114. Each of these components may compute a different status of the cells 101.

The state of capacity component 112 may compute a status of the state of capacity of the cells 101 (either individually or collectively). The state of capacity is the amount of energy capable of being stored at a given time by the cells 101, independent of the amount of energy actually stored. The state of capacity of the cells 101 may be computed using historical data of temperature and age of the cells 101. As another option, the state of capacity of the cells 101 may be computed using past or current performance parameters such as discharge rate of the cells 101, voltage of the cells 101 over time, voltage of the cells 101 in response to load change, impedance change of the cells 101, or other techniques of detecting battery capacity loss.

The state of charge component 113 may compute a status of the state of charge of the cells 101 (either individually or collectively). State of charge may be expressed as a percentage of energy currently stored in a cell compared to the state of capacity of the cell at a given time. State of charge of the cells 101 may be computed by measuring voltage of the cells 101, integrating the measured current of the cells 101 over time (for example, coulomb counting), using predictive model based methods, and/or by other techniques.

The health component 114 may determine a status of the health of the cells 101 (either individually or collectively). The health may be a data parameter or set of parameters that indicates the overall health of the cells 101, and may be used to schedule future replacements based on impending failure or lack of capability. The health may be computed by evaluating one or more of: the voltage of the cells 101 in response to a load, impedance changes of the cells 101, voltage imbalance between cells 101 in the module 100, overall module 100 calendar life, rate of change of impedance of cells 101, rate of change of state of capacity of the cells 101, detected electronics failure, or other such techniques.

The status of the cells 101 as computed by the state of capacity component 112, state of charge component 113, or health component 114 may be communicated to and through the master/module interface 400. The status of the cells 101 may be communicated to the battery master processor 210. Similarly, the results of the test may also be communicated to and through the master/module interface 400 and to the battery master processor 210.

The raw data component 115 may be configured to provide raw, rather than processed data. For example, the raw data component 115 may be configured to output a stream of data stored in the data logging memory component 118 or generated by the analog-to-digital conversion component. The raw data may be communicated to the master/module interface 400.

The security/identification component 116 may store information related to the identification of the module 100. For example, the identification information may identify different aspects of the module 100, such as the module maker, chemistry type, number of cells, serial number, manufacture date, mass, new and aged capacity data, minimum and maximum operation voltage, minimum and maximum safe voltage, maximum current demand, expected life in years, calibration parameters, a code to define the compatibility of the module 100 with the aircraft system 500, or the like. The identification information may be communicated from the battery module processor 110 to and through the master/module interface 400 and to the battery master processor 210.

The security/identification component 116 may also store security information that can be used to implement security procedures or protocols. The data may be encrypted or otherwise protected from modification to prevent tampering, unauthorized repair, or counterfeit modules from being installed in the application. The security information may be communicated from the battery module processor 110 to and through the master/module interface 400 and to the battery master processor 210.

The battery master system 200 may include a disconnect 201, master disconnect logic 202, a current sensor 203, a disconnect 204, a fuse 205, short circuit protection 206, lightning protection 207, and a battery master processor 200.

The disconnect 201 may function in a manner similar to that of disconnect 104. Based on the status of the master disconnect logic 202, the power being received from the module 100 to and through the master/module interface 400 may be disconnected from flowing into the master 100. Disconnect 204 may be a redundant disconnect device implemented for regulatory requirements and fail-safe purposes, and may be optional.

The master disconnect logic 202 may communicate with each module 100. When a given module's disconnect 104 is electrically connected, the master disconnect logic 202 may prevent the module 100 from opening the disconnect 104 in the event of a short circuit if the fault is detected to be outside the battery system. When a given module's disconnect 104 is electrically disconnected, the master disconnect logic 202 may inhibit the disconnect 104 from becoming electrically connected (or cause the disconnect 104 to become electrically disconnected) if there is some fault, such as if the configuration of the module 100 is incorrect, the serial number or compatibility code of the module 100 indicates incompatibility, or the module 100 indicates a failure or out of range value. In a system with multiple modules 100, the master disconnect logic 202 may inhibit the disconnect 104 from becoming electrically connected (or cause the disconnect 104 to become electrically disconnected) if the voltage or state of charge of a given module 100 is not compatible with other modules 100. In such a case, the cells 101 may be recharged to bring the voltage of the cells 101 within a tolerance range before allowing the given module's disconnect 104 to become electrically connected. This may prevent relatively large currents from flowing into or out of the given module 100 into other modules 100.

The short circuit protection component 206 may measure the battery output current by interfacing with the current sensor 203. The short circuit protection 206 may also be connected with the disconnect 201 (not shown) and the current sensors 103 (not shown). The short circuit protection 206 may contain logic to determine the location of an over-current (short circuit) event, and determine which disconnect to open based on the fault location and magnitude.

The lightning protection 207 may contain lightning protection components that may be active or passive devices, including transorbs, spark gaps, diodes, zener diodes, or other devices suitable for absorbing or controlling injected lightning current resulting from a lightning strike.

The battery master processor 210 may provide signal input to the master disconnect logic 202. The processor 210 may also communicate data to and through the aircraft/master interface 500 to the aircraft host system 300.

The battery master processor 210 may also receive data from the master/module interface 400 which is delivered by the battery master system 200. The data may be provided or communicated from the battery module processor 110. The battery master processor 210 may receive data provided by a plurality of battery module processors 110 if more than one module 100 is present in the system 10. The battery master processor 210 may aggregate information provided in data from a plurality of battery module processors 110. For example, the battery master processor 210 may aggregate state of charge information and state of capacity information. The battery master processor 210 may also aggregate state of health information. Such aggregation may determine the overall capacity, state of charge, and state of health of an entire battery system. Such information may be communicated to and through the aircraft/master interface 500 and to the aircraft host system 300.

The battery master processor 210 may also compare the various performance metrics of the module 100 and compare it against required battery performance. If the module 100 cannot provide a sufficient level of performance, then the battery master processor 210 may communicate fault information to the aircraft host system 300 or take other actions like causing the master 200 to disconnect from the module 100 or from the aircraft host system 300.

The battery master processor 210 may also determine whether one or more of the modules 100 are compatible with each other. For example, if different modules 100 have different chemistry types, it may be possible to determine whether such different modules 100 are compatible.

Figure 6:
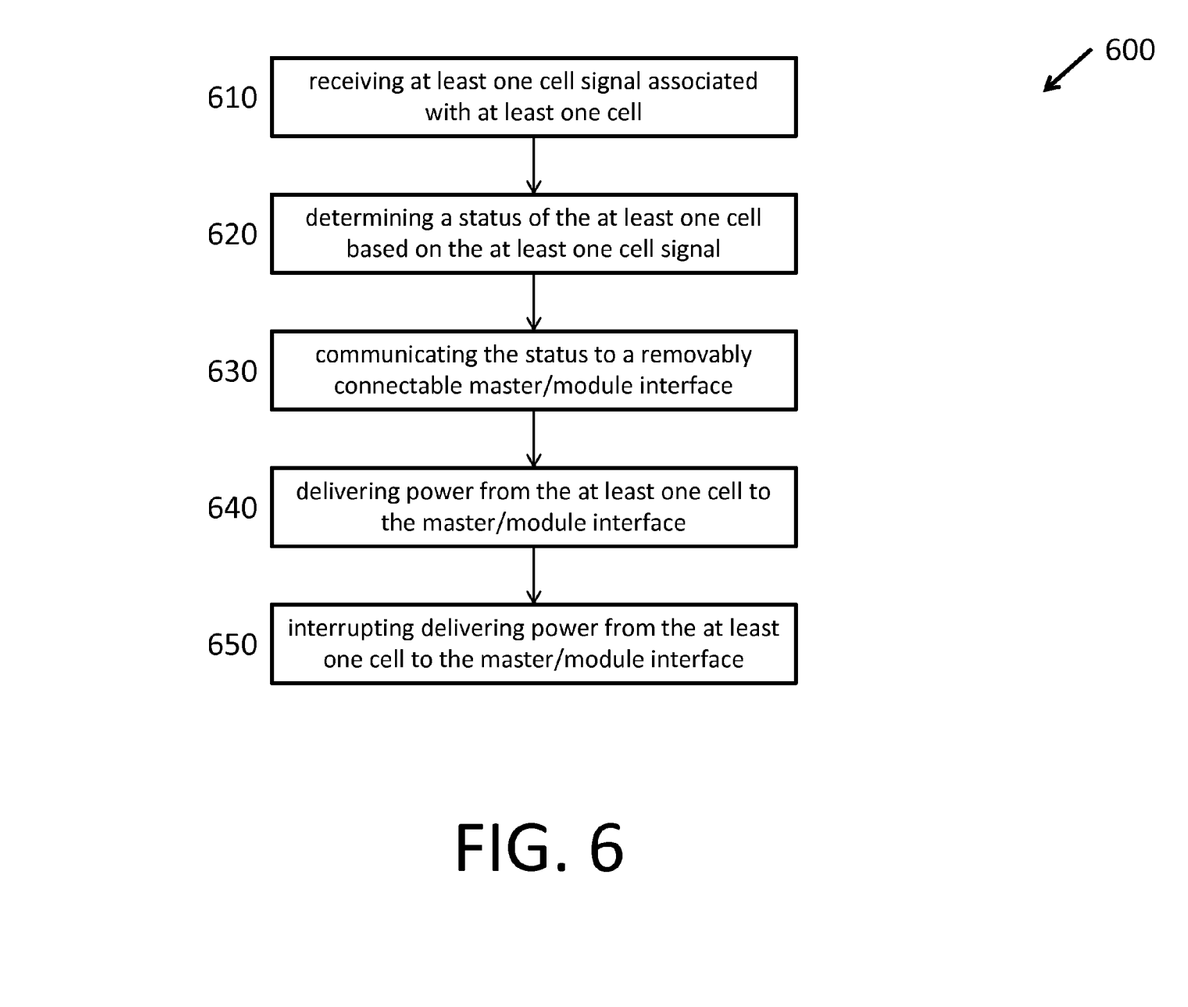
FIG. 6 illustrates a flowchart of a method for providing power in an aircraft, according to techniques of the present application.

FIG. 6 illustrates a flowchart 600 of a method for providing power in an aircraft, according to techniques of the present application. The steps of the flowchart 600 may be performed in a different order, or may be performed wholly or partially in parallel. Some steps of the flowchart 600 may be omitted. The method illustrated by the flowchart 600 may be implemented by, for example, a system similar to system 10.

At step 610, at least one cell signal associated with at least one cell may be received. For example, such a signal may be received by a battery module processor 110. Such a signal may be reflective of temperature, voltage, or current provided by the at least one cell. At step 620, a status of the at least one cell may be determined based on the at least one signal. For example, such a status may be determined by the battery module processor 110. Such a status may include, for example, state of charge, state of capacity, or health of the at least one cell.

At step 630, the status may be communicated to a removably connectable master/module interface, such as interface 400. The status may be communicated by the battery module processor 110. At step 640, power may be delivered from the at least one cell to the master/module interface. At step 650, the power delivered to the at least one cell may be interrupted, for example, by disconnect 104.

The method may also include additional steps, such as storing security information or identification, for example, at the battery module processor 110. The security or identification information may be communicated, for example by the battery module processor 110, to the removably connectable master/module interface 400.

The battery master processor 210 may also be reprogrammed, for example by the aircraft host system 300, to accommodate changes in module 100 characteristics.

By implementing a module 100, master 200, and master/module interface 400 as described by various embodiments herein, it may be easier to implement changes in the battery system by disconnecting a module 100 from the master/module interface 400 and adding a new one with different characteristics. The battery module processor 110 may facilitate this process by determining statuses such as state of charge, state of capacity, and health of the cell 101.

By determining such statuses in the module 100 rather than in the master 200, the system 10 may be more adaptable to reconfiguring modules 100 or accommodating modules 100 with different characteristics, such as different chemistries. For example, certification and regulatory approval of aircraft parts may require relatively extensive testing. Isolating the scope of required changes to the module 100 as a self-contained unit may enable these certification and qualification tests to only be required on the module 100 itself.

Once the module 100 is tested and conforms to the standard interfaces and minimum requirements, the battery master system 200 may not require substantial additional modification, thus avoiding the need for recertification. This may have substantial cost and schedule benefits related to the testing and cost of test articles as well as allowing a single qualification program to allow the module 100 to be used in multiple instances within a single aircraft platform or across multiple platforms, realizing economies of scale and amortizing the testing costs across multiple benefiting products.

It may also be possible to implement the master 200 to coordinate if and how one or modules 100 are added to the power bus. The master 200 may have a list of compatibility requirements. When a module 100 is connected to interface 400, the configuration of the module 100 may be compared to the compatibility requirements by the master processor 210. If the module 100 does not comport with the compatibility requirements, then the master 200 may prevent the module 100 from connecting to the power bus, for example, by disconnecting the module 100 with the disconnect 201. If the module 100 is not compatible, the master processor 210 may generate an appropriate error message for communication with the aircraft host system 300. The master processor 210 may also cause a visible error indication that may assist a mechanic to determine which module 100 is incompatible.

Once it is determined that a module 100 is compatible with the master 200, the master 200 may determine whether the module 100 is compatible with other modules already connected to the power bus. If the module 100 is incompatible with other modules, then the master 200 may prevent the module 100 from connecting to the power bus, for example, by disconnecting the module 100 with the disconnect 201. If the module 100 is not compatible with other modules, the master processor 210 may generate an appropriate error message for communication with the aircraft host system 300. The master processor 210 may also cause a visible error indication that may assist a mechanic to determine which module 100 is incompatible with other modules.

If the module 100 is compatible with the master 200 and/or compatible with other modules, status information (for example, cell chemistry, state of charge, state of capacity, or health) from the module 100 may be received and evaluated by the master 200. The master 200 may check for minimum requirements of the module 100. For example, the master 200 may check to see if the age of the battery is acceptable. In some instances, a hard expiration date may be programmed into the module 100. Similarly, the amount of remaining life of the module 100 may be evaluated. As another example, a maintenance interval may be programmed into the aircraft host system 300. The master 200 may indicate modules that may not survive until the next scheduled maintenance check. This may allow for dispatch, but require scheduling of a future maintenance task. As another example, built-in tests or internal circuit checks may be evaluated on the module 100. Other battery parameters may be evaluated to determine whether they are compatible with the minimum requirements that may be determined by the aircraft host system 300. Such minimum requirements may vary from aircraft to aircraft. If minimum requirements are not met, the master 200 may prevent the module 100 from connecting to the power bus. The master processor 210 may also cause a visible error indication that may assist a mechanic to determine which module 100 does not meet minimum requirements.

If the module 100 meets minimum requirements, the state of charge of the module 100 may be evaluated by the master 200. If the state of charge of the module 100 is compatible with the overall battery system, the module 100 (or other modules) may be required to charge or discharge prior to being allowed to connect to the power bus. Such a test may be applicable for both parallel and series connections of the modules as state of charge balance may be important in both configurations. Once the state of charge of the module 100 is matched within a specified tolerance to the rest of the battery system, the module 100 may be connected to the power bus.

By evaluating status information one or more modules 100, it may be possible to verify that the modules 100 meet predefined mission, regulatory requirements, or compatibility requirements of a vehicle, such as an aircraft. For example, such verification may occur for modules 100 that have differing cell chemistries to check for compatibility of such chemistries. It may be possible to verify, based on status information, whether the modules 100 meet mission requirements of the vehicle.

Mission requirements may include power requirements. For an aircraft, mission requirements may relate to the type of flight, the duration of the flight, or equipment to be used during the flight. An aircraft mission from the battery's perspective may be a series of successive discharge requirements or a combination of various discharge requirements that, in total, reach a maximum possible required discharge scenario. According to certain known techniques, this has been summed to a single battery energy/capacity value that is required, which may implicate the end of life criteria for a custom developed battery. Looking forward to more sophisticated load management techniques, the battery energy available may factor into the minimum required mission calculation by the aircraft and allow a battery that may not be able to perform all aircraft missions to assist in performing the desired mission, thus effectively allowing longer battery life per module 100 than a hard end of life capacity requirement would allow.

Regulatory requirements may involve various applications and installation locations that may have different levels of regulatory requirements. It may be possible that various modules 100 could meet different levels of regulatory criteria for power source availability. Additionally, modules 100 may be qualified to various regulatory requirements levels for failures, and these could be variable based on installation and aircraft platform requirements or different based upon systems that may or may not be built into the master 200 rather than the modules 100. A regulatory requirements check may ensure that an appropriate level of availability and levels are met by the installed module 100. Regulatory requirements may derive from or relate to FAA mandated requirements.

Compatibility requirements may involve various battery technologies that have different voltage discharge curves. Battery types may be able to be utilized in parallel, while others may not due to the different shape of the discharge curve. The same situation may be true for batteries in series, but in this case the ability of the module 100 to provide identical current as the others without damage may be more critical than the specific voltage discharge curve. Finally, for a specialized load, a battery voltage discharge curve may impact operation, and only certain module 100 types may be allowed for use in these applications. The compatibility check would ensure that the module 100 discharge characteristics are compatible both with the end use load requirements and with the other modules 100 installed in a mufti-module configuration.

As used herein, the phrase "at least one of", when used with a list of items, means different combinations of one or more of the listed items may be used but only one item in the list of items may be needed. The item may be a particular object, thing, or category. In other words, "at least one of" means that any combination of items and any number of items may be used from the list but not all of the items in the list are required.

For example, "at least one of item A, item B, or item C" may include, without limitation, item A, item A and item B, or only item B. For example, "at least one of item A, item B, or item C" may include, without limitation, item A; both item A and item B; item A, item B, and item C; or item B and item C. In other examples, "at least one of" may be, for example, without limitation, two of item A, one of item B, and ten of item C; four of item B and seven of item C; or some other type of combination.

It will be understood by those skilled in the art that various changes may be made and equivalents may be substituted without departing from the scope of the novel techniques disclosed in this application. In addition, many modifications may be made to adapt a particular situation or material to the teachings of the novel techniques without departing from its scope. Therefore, it is intended that the novel techniques not be limited to the particular techniques disclosed, but that they will include all techniques falling within the scope of the appended claims.

The invention claimed is:

1. A system for providing power, wherein the system comprises:
   a master/module interface configured to:
      removably connect to a first battery module system,
      receive power from at least one cell in the first battery module system,
      receive, from a battery module processor in the first battery module system, a status of the at least one cell in the first battery module system,
      removably connect to a second battery module system,
      receive power from at least one cell in the second battery module system, and
      receive, from a battery module processor in the second battery module system, a status of the at least one cell in the second battery module system; and
   a battery master system connected to the master/module interface and including a battery master processor, wherein the battery master system is configured to:
      receive, from the master/module interface, the power from the at least one cell in the first battery module system,
      deliver, from the master/module interface, the status of the at least one cell in the first battery module system to the battery master processor,
      receive, from the master/module interface, the power from the at least one cell in the second battery module system, and
      deliver, from the master/module interface, the status of the at least one cell in the second battery module system to the battery master processor, wherein a chemistry of the at least one cell in the first battery module system is different from a chemistry of the at least one cell in the second battery module system.

2. The system of claim 1, wherein the battery master system is further configured to determine whether the first battery module system is compatible with the second battery module system.

3. The system of claim 1, wherein the battery master system is further configured to:
   cause the power from the at least one cell in the first battery module system to be disconnected from the master/module interface; and
   cause the power from the at least one cell in the second battery module system to be disconnected from the master/module interface.

4. The system of claim 1, wherein the battery master system is further configured to:
   cause the power from the at least one cell in the first battery module system to be disconnected from the master/module interface through a disconnect in the first battery module system; and
   cause the power from the at least one cell in the second battery module system to be disconnected from the master/module interface through a disconnect in the second battery module system.

5. The system of claim 1, wherein the battery master system is further configured to provide recharging power to the master/module interface for the at least one cell of the first battery module and the at least one cell of the second battery module.

6. The system of claim 1, wherein the status of the at least one cell of the first battery comprises at least one of a state of charge of the at least one cell of the first battery, a state of capacity of the at least one cell of the first battery, or a health of the at least one cell of the first battery.

7. A system for providing power, wherein the system comprises:
   a master/module interface configured to:
      removably connect to a first battery module system,
      receive power from at least one cell in the first battery module system, and
      receive, from a battery module processor in the first battery module system, a status of the at least one cell in the first battery module system; and
   a battery master system connected to the master/module interface and including a battery master processor, wherein the battery master system is configured to:
      receive, from the master/module interface, the power from the at least one cell in the first battery module system,
      deliver, from the master/module interface, the status of the at least one cell in the first battery module system to the battery master processor, and
      send a signal to the first battery module system to instruct the first battery module system to disconnect the at least one cell in the first battery module system from the master/module interface.

8. The system of claim 7, wherein:
   the master/module interface is further configured to:
      removably connect to a second battery module system,
      receive power from at least one cell in the second battery module system, and
      receive, from a battery module processor in the second battery module system, a status of the at least one cell in the second battery module system; and
   the battery master system is further configured to:
      receive, from the master/module interface, the power from the at least one cell in the second battery module system, and
      deliver, from the master/module interface, the status of the at least one cell in the second battery module system to the battery master processor.

9. The system of claim 8, wherein a chemistry of the at least one cell in the first battery module system is different from a chemistry of the at least one cell in the second battery module system.

10. The system of claim 8, wherein the battery master system is further configured to determine whether the first battery module system is compatible with the second battery module system.

11. The system of claim 8, wherein the battery master system is further configured to cause the power from the at least one cell in the second battery module system to be disconnected from the master/module interface.

12. The system of claim 8, wherein the battery master system is further configured to:
cause the power from the at least one cell in the first battery module system to be disconnected from the master/module interface through a disconnect in the first battery module system; and
cause the power from the at least one cell in the second battery module system to be disconnected from the master/module interface through a disconnect in the second battery module system.

13. The system of claim 8, wherein the battery master system is further configured to provide recharging power to the master/module interface for the at least one cell of the first battery module and the at least one cell of the second battery module.

14. The system of claim 7, wherein the status of the at least one cell of the first battery comprises at least one of a state of charge of the at least one cell of the first battery, a state of capacity of the at least one cell of the first battery, or a health of the at least one cell of the first battery.

\* \* \* \* \*